(12) United States Patent
DiBene, II et al.

(10) Patent No.: US 6,698,511 B2
(45) Date of Patent: Mar. 2, 2004

(54) VORTEX HEATSINK FOR HIGH PERFORMANCE THERMAL APPLICATIONS

(75) Inventors: Joseph Ted DiBene, II, Oceanside, CA (US); Farhad Raiszadeh, San Diego, CA (US)

(73) Assignee: Incep Technologies, Inc., San Diego, CA (US)

( * ) Notice: Subject to any disclaimer, the term of this patent is extended or adjusted under 35 U.S.C. 154(b) by 0 days.

(21) Appl. No.: 10/150,730

(22) Filed: May 17, 2002

(65) Prior Publication Data

US 2002/0174980 A1 Nov. 28, 2002

Related U.S. Application Data

(60) Provisional application No. 60/292,125, filed on May 18, 2001.

(51) Int. Cl.[7] .................................................. F28F 7/00
(52) U.S. Cl. ...................... 165/185; 165/80.3; 361/697; 361/704; 174/16.3; 257/722
(58) Field of Search ................ 165/80.3, 185; 361/703, 704, 697; 257/706, 722; 174/16.3

(56) References Cited

U.S. PATENT DOCUMENTS

| 5,380,211 | A |   | 1/1995  | Kawaguchi et al. |        |
|-----------|---|---|---------|------------------|--------|
| 5,437,328 | A | * | 8/1995  | Simons           | 165/185 |
| 5,927,385 | A | * | 7/1999  | Yeh              | 165/80.3 |
| 6,089,315 | A | * | 7/2000  | Lee et al.       | 165/185 |
| 6,141,220 | A | * | 10/2000 | Lin              | 361/704 |
| 6,179,046 | B1| * | 1/2001  | Hwang et al.     | 165/80.3 |
| 6,181,556 | B1| * | 1/2001  | Allman           | 361/704 |
| 6,313,399 | B1| * | 11/2001 | Suntio et al.    | 174/16.3 |
| 6,343,016 | B1| * | 1/2002  | Lin              | 361/704 |
| 6,370,025 | B1| * | 4/2002  | Yasufuku et al.  | 361/704 |
| 6,446,707 | B1| * | 9/2002  | White            | 165/80.3 |

* cited by examiner

*Primary Examiner*—Terrell McKinnon
(74) *Attorney, Agent, or Firm*—Knobbe, Martens, Olson & Bear LLP

(57) ABSTRACT

A method, apparatus, and article of manufacture for improving the thermal efficiency for heat transfer from an electronic device using a vortex heatsink arrangement. The apparatus comprises a fin array having a plurality of fins and having a variable fin density, the fin array including a first fin array region proximate to and in thermal contact with the heat dissipating device; a second fin array region distant from the heat dissipating device. The first fin region includes a first fin density and the second fin region includes a second fin density less than the first fin density.

14 Claims, 13 Drawing Sheets

Section
D-D

VORTEX HEATSINK FOR HIGH PERFORMANCE THERMAL APPLICATIONS

CROSS-REFERENCE TO RELATED APPLICATIONS

This application claims benefit of the following U.S. Provisional Patent Application, which is incorporated by reference herein:

application Ser. No. 60/292,125, entitled "VORTEX HEATSINK FOR LOW PRESSURE DROP HIGH PERFORMANCE THERMAL MANAGEMENT ELECTRONIC ASSEMBLY SOLUTIONS," by Joseph T. DiBene II and Farhad Raiszadeh, filed May 18, 2001.

BACKGROUND OF THE INVENTION

1. Field of the Invention

This invention relates in general to high performance heatsink designs to improve the thermal management in high power dissipating and high performance electronic circuits.

2. Description of the Related Art

As circuitry in electronics becomes more complex, thermal management of the circuitry has become more difficult. The common method for cooling electronics has been to use either forced air convection through heatsinks or to use methods which incorporate heatpipes or vapor chambers. The latter methods have been to date fairly expensive relative to common aluminum or copper based heatsinks. Until recently, thermal management of high performance electronics has been manageable without the use of such expensive and elaborate thermal devices, such as heatpipes, due to the low power consumption of the electronic devices. However, the recent insurgence of the power requirements for electronics, such as microprocessors, has dictated that larger and more elaborate thermal solutions become necessary.

More recently advances in silicon fabrication techniques have permitted the manufacturer of high performance IC packages with operating voltages at or below 1 volt and power levels in excess of 100 watts. Additionally, the size of the IC dies have shrunk which has increased the thermal density or heatflux through the thermal interfaces to the heatsink. This has had a two-fold negative effect in that not only has power increased, which has often necessitated a larger heatsink, but the thermal density has increased also requiring better thermal conduction through to the fins of the heatsink enabling heat to be more efficiently extracted via forced convection through these fins. One method to mitigate the heat flux density problem somewhat is to improve the lateral conductivity of the heatsink base enabling better thermal transfer to the fins. However, moving to vapor chamber or heatpipe or higher thermal conductivity base material and designs to more efficiently transfer heat to the fins is more costly than using standard heatsink materials such as aluminum and copper for heatsink designs. Alternatively, one may increase the airflow through the heatsink thus improving the rate of heat transfer through forced convection. However, this increases the burden at the system level air moving devices and often the increase in larger fans or blowers and sheer volumetric space to accommodate these larger devices is prohibitive. Thus, it is seen that there is a need for a new heatsink technology that not only uses standard heatsink materials, such as aluminum or copper, but also is more efficient in the conduction and convection paths thus resulting in a more efficient design overall.

SUMMARY OF THE INVENTION

To address the requirements described above, the present invention discloses a method and apparatus for cooling a heat dissipating device. The apparatus comprises a fin array having a plurality of fins and having a variable fin density, the fin array including a first fin array region proximate to and in thermal contact with the heat dissipating device; a second fin array region distant from the heat dissipating device. The first fin region includes a first fin density and the second fin region includes a second fin density less than the first fin density.

BRIEF DESCRIPTION OF THE DRAWINGS

Referring now to the drawings in which like reference numbers represent corresponding parts throughout.

DETAILED DESCRIPTION OF PREFERRED EMBODIMENTS

Figure 1:
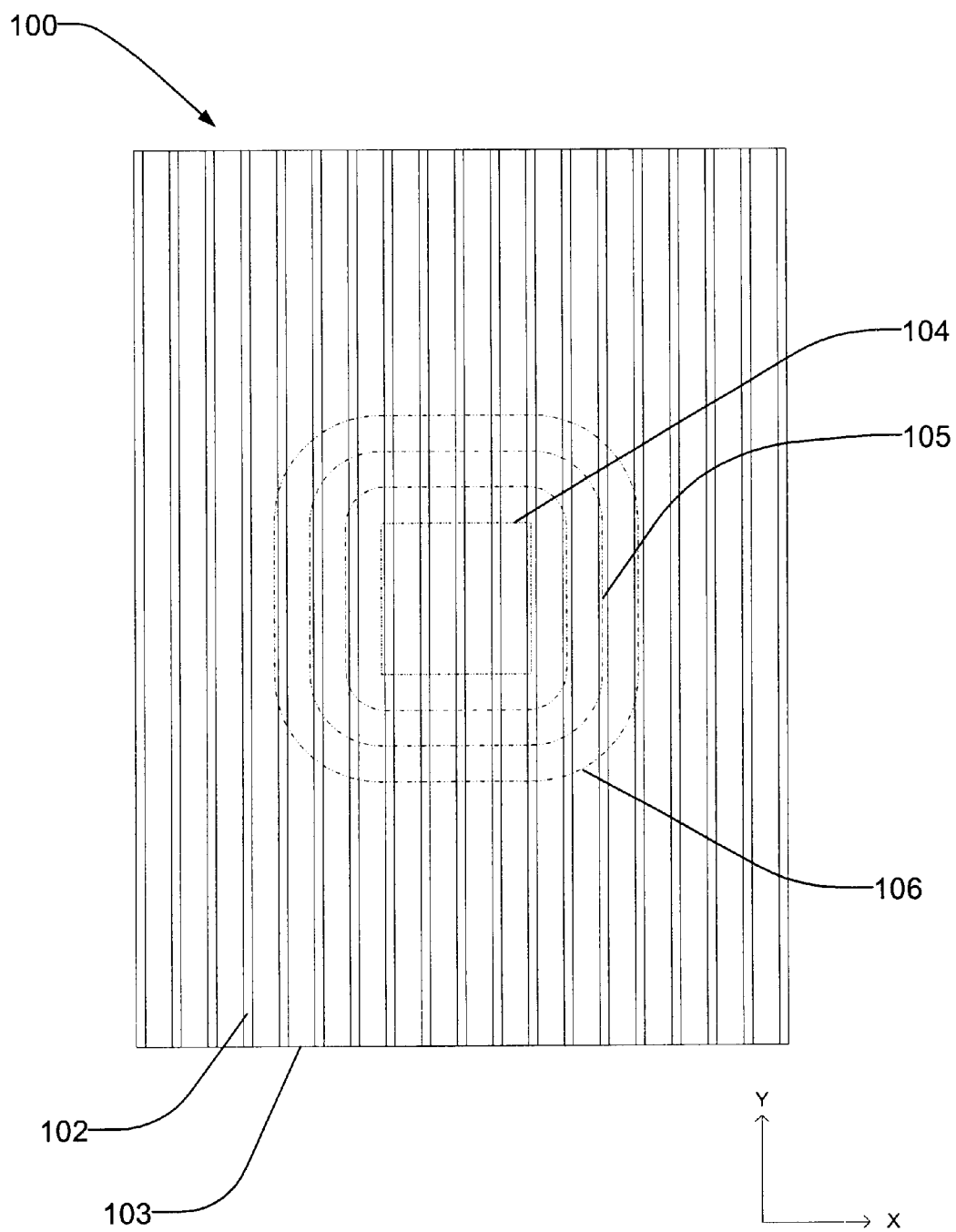
FIG. 1 is a plan view illustrating a common heatsink design with linear fins where a device is located such that thermal potential lines show the heat generation region relative to some of the fin connections.

In the following description, reference is made to the accompanying drawings which form a part hereof, and which is shown, by way of illustration, several embodiments of the present invention. It is understood that other embodiments may be utilized and structural changes may be made without departing from the scope of the present invention.

Overview

The present invention discloses heatsink apparatuses for cooling high performance electronic components using cross-flow air convection methods. In one embodiment, the heatsink comprises a fin array section which is curvilinear in two dimensions. The curvilinear fins enable the connection region of the fins to the baseplate section to be more dense, allowing a better heat conduction path from the baseplate to the fins over conventional heatsink technologies. Variations of this invention, for cost/performance tradeoffs, include a combination of altering the baseplate geometry and fin array to baseplate connection. The baseplate/fin joint region may be convex, dome-shaped, or flat depending upon the cost/performance tradeoffs.

In another embodiment of the invention the fin array section is curvilinear in three dimensions. This results in the best pressure drop/heat flux performance overall in the preferred embodiment of the invention. The fins are shaped in a vortex arrangement as in the first method but are also folded outwards to take up the maximum rectangular cross-sectional room available to maximize heat transfer from the fins to air while simultaneously minimizing the pressure drop through the heatsink fin array. Baseplate/fin array interconnect geometries, such as those described for the first instantiation of the invention may also be applied to this construction as well.

Conventional Heatsink Assembly

Modern electronic high performance packages require very high performance heatsink designs to efficiently manage the heat generated by such devices. The reason for this is that high performance electronic devices (such as microprocessors) are increasing in power while the actual size of the dies themselves are either staying constant in size or are shrinking to reduce cost of fabrication and increase yields. The dies are typically protected with a copper heat spreader (though some dies are exposed as well) which is used to spread heat from the die to the lid. However, the inefficiency of the thermal interface material between the die and lid often prohibits good heat spreading and often the lid is kept quite thin for weight and cost reasons which further limits its heat spreading capability. Thus, the heatflux between the lid and the heatsink baseplate is often very dense meaning that the region where the heat density is the greatest is in a small region near the die and lid. When the heat is transferred from the device lid to the heatsink baseplate it spreads vertically and laterally across the heatsink base where it eventually is transferred to the fins. Forced air then pulls the heat off of the fins through convection resulting in the transfer of the heat from the heatsink to the surrounding air which is expelled out of the system through some type of venting arrangement. Typically, the baseplate is made up of such material that its lateral conductivity is limited and most of the heat is transferred to the fin sections directly above the device. Because heat is primarily transferred to a small section of the fins in the fin array the efficiency of the heatsink is limited and often more air-flow is required to cool the device which places a burden on the air moving device and system air-flow design which increases the cost of the thermal solution overall.

FIG. 1 is a plan view of a heatsink assembly 100. The heat sink assembly 100 has fins 102 which are linear and perpendicular to a heatplate or baseplate 103. The linear and perpendicular fin arrangement is typically inexpensive to fabricate. The fins 102 can be folded, crimped, or extruded.

The heatsink assembly 100 is thermally coupled to a heat dissipating device 104 (shown outlined underneath heatsink assembly 100 in FIG. 1). The number and geometry of the fins 102 connecting to the baseplate 103 can be selected in accordance with the density of the heatflux from the heat dissipating device, and cooling requirements.

FIG. 1 also illustrates contour lines of equal heatflux potential encompassing heat flux regions 105 and 106. The highest heat flux is generally present in the proximity of the device 104 itself, and the heat flux diminishes as the distance from the heat dissipating device 104 increases along the x or y axis. For example, the heat flux at the outer boundary of heatflux region 105 is typically less than the heat flux of the region directly above the heat dissipating device 104, the heat flux at the outer boundary of heat flux region 106 is typically less than the heat flux at the boundary of heat flux region 105, and so on.

A substantial portion of the heatflux is encompassed in heatflux region 106. Consequently, the fins 102 (and the regions of the fins) located proximate the heatflux region 106 are the most efficient in transferring heat. One method of increasing heat transfer is to increase the fin density in this region. However, simply increasing the number of fins (and hence the fin density) often has the adverse effect of increasing the pressure drop through the heatsink and thus the system chassis. When the power increases, heat density increases (for the same heatflux region) and, typically greater fin density is required. Subsequently, more airflow is required to force the air through the fins in order to transfer the heat to the; air. The transfer of heat through the fin section may be described using the well known non-linear Navier-Stokes equation—for fluid flow in the incompressible laminar form—as shown in a simplified version of the equation below;

$$\vec{V}\nabla\vec{V} = -\frac{\nabla p}{\rho} + v\nabla^2\vec{V}$$

Where V is the macro particle velocity vector through the system, p is the pressure, ρ is the air density, and v is the kinematic viscosity.

The object is to achieve maximum cooling efficiency by maximizing the particle velocity through the heat sink fins, minimizing the pressure drop through the system, and maximizing the heat transfer through the heatsink base to the fins. Furthermore, from a practical perspective, this should be achieved with conventional materials and processing methods and not require complex and costly fluid transfer systems such as vapor chambers and pumps. The present invention achieves these goals.

Vortex Heatsink Assembly

Figure 2:
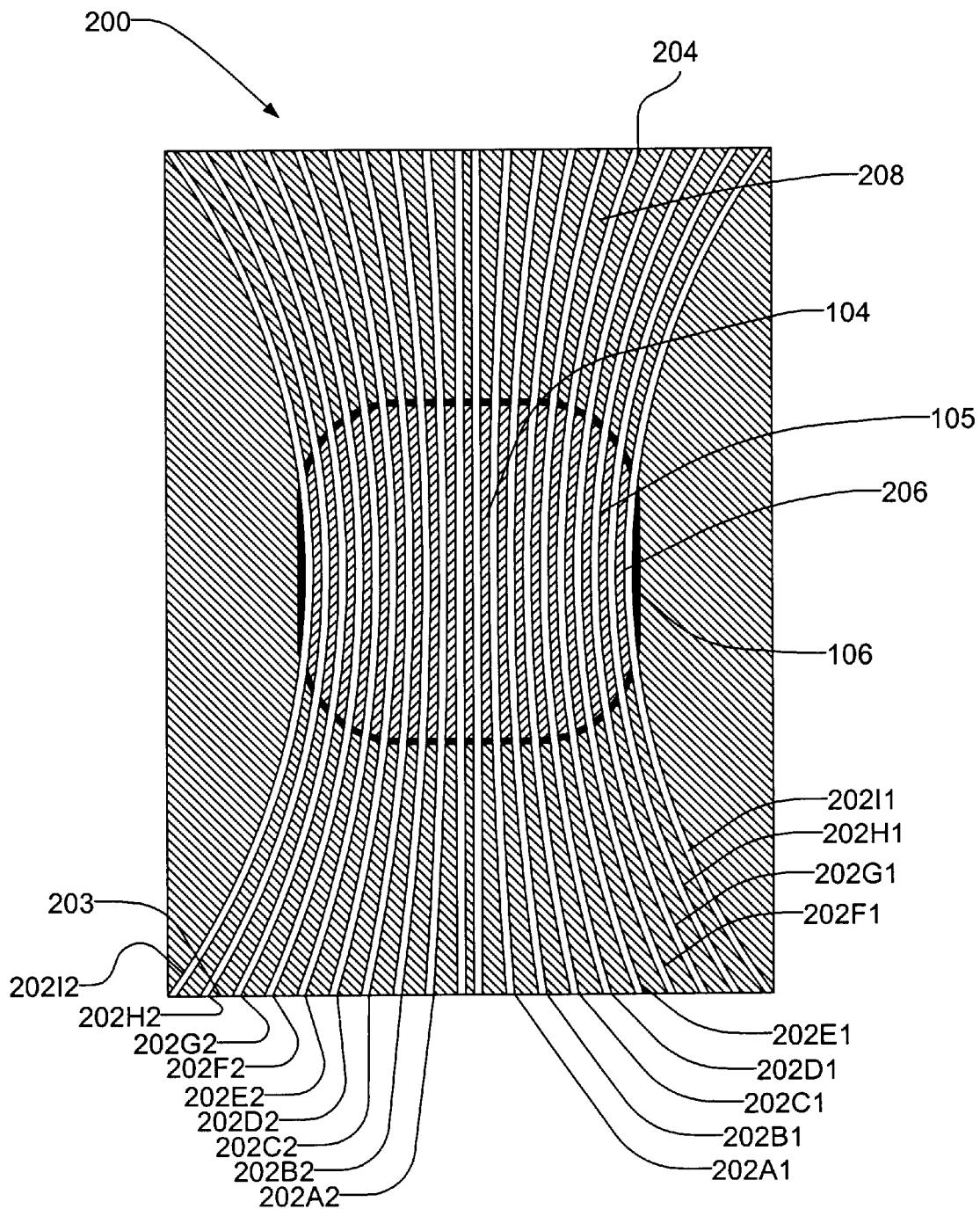
FIG. 2 is a plan view of an instantiation of the given invention with curvilinear fins where a device is located such that thermal potential lines show the heat generation region relative to the central portion of all fin connections.

FIG. 2 is a plan view of one embodiment the invention. Heat sink assembly 200 has heat-dissipating device 104 and heatflux regions 105 and 106 analogous to those described in FIG. 1.

The heat sink assembly 200 includes a fin array 204 comprising a plurality of fins 202A1–202H2. In the illustrated embodiment, the fins 202 include a first plurality of curvilinear concave fins 202A1–202I1 and a second plurality of curvilinear concave fins 202A2–202I2 facing the first plurality of curvilinear concave fins.

The fins 202 are arranged to define a first fin array region 206 proximate to and in thermal contact with the heat dissipating device 104 (e.g. coincident with the heat flux region 106), and a second fin array region 208 (e.g., the region of the fins 202 not within the heat flux region 206). The fin arrangement and shape create narrowing in the proximity of the first fin array region 206, which is proximate the heat flux region 106. This creates a variable fin density in which the first fin array region 206 includes a first fin density, and the second fin array region 208 includes a second fin density less than the first fin density. In one embodiment of the invention, the narrowing is characterized by a venturi shape.

In the illustrated embodiment, the fins 202A1–202H2 are curvilinear in two dimensions. While the number of fins is the same as shown in FIG. 1, all of the fins 202A1–202H2 now cross the heatflux region 106 rather than just a limited number of the fins. This has the advantage of increasing the heat transfer area of the fins 202A1–202H2 themselves in this region thus increasing the conduction to the fins 202A1–202H2 overall. The air moves into the fins and flows into the 'vortex' region near the center of the fin array picking up velocity as it goes. The heat is then transferred from the fins and is exhausted out the back of the heatsink. The vortex is optimized to minimize air pressure drop through the vortex portion of the heatsink.

Fabrication of the fin array may be accomplished with different techniques. Each of the fins of half the vortex heatsink may be formed individually and then 'crimped' together as in a crimp-fin process. The entire fin array may then be brazed, soldered, or press-fit into the baseplate 103. Alternatively, the fins may be folded together from one piece of sheet metal as in a folded-fin process and then formed into a vortex in the middle by pressing the folded array in the middle section as shown in FIG. 2. The final fin array may then be brazed or soldered onto the baseplate 103 as well. Other methods such as hydro-forming may also be employed to fabricate the heatsink fins 202A1–202H2 and assembly as well.

Figure 3A:
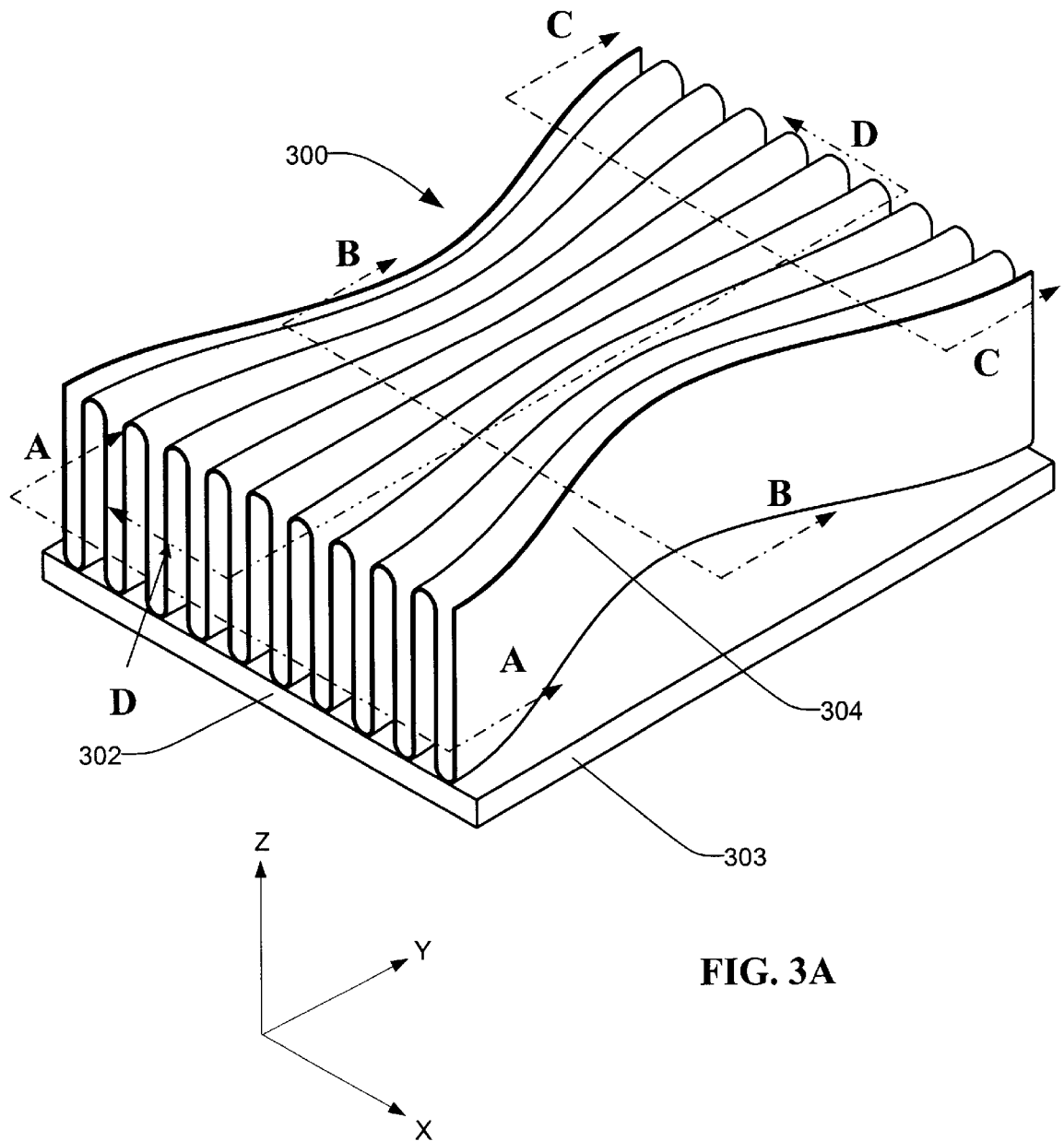
FIG. 3A is a three-dimensional isometric view of the invention shown in FIG. 2 with a dome-shaped base.

FIG. 3A shows an isometric view of the embodiment of the invention shown in FIG. 2. Assembly 300 comprises a baseplate 303, and fin array 304. For purposes of illustration, the top portion of the fin array of assembly 300 is flat. However, the top portion of the fin array of assembly 300 may have different shapes (such as dome-shaped or convex).

Figure 3B:
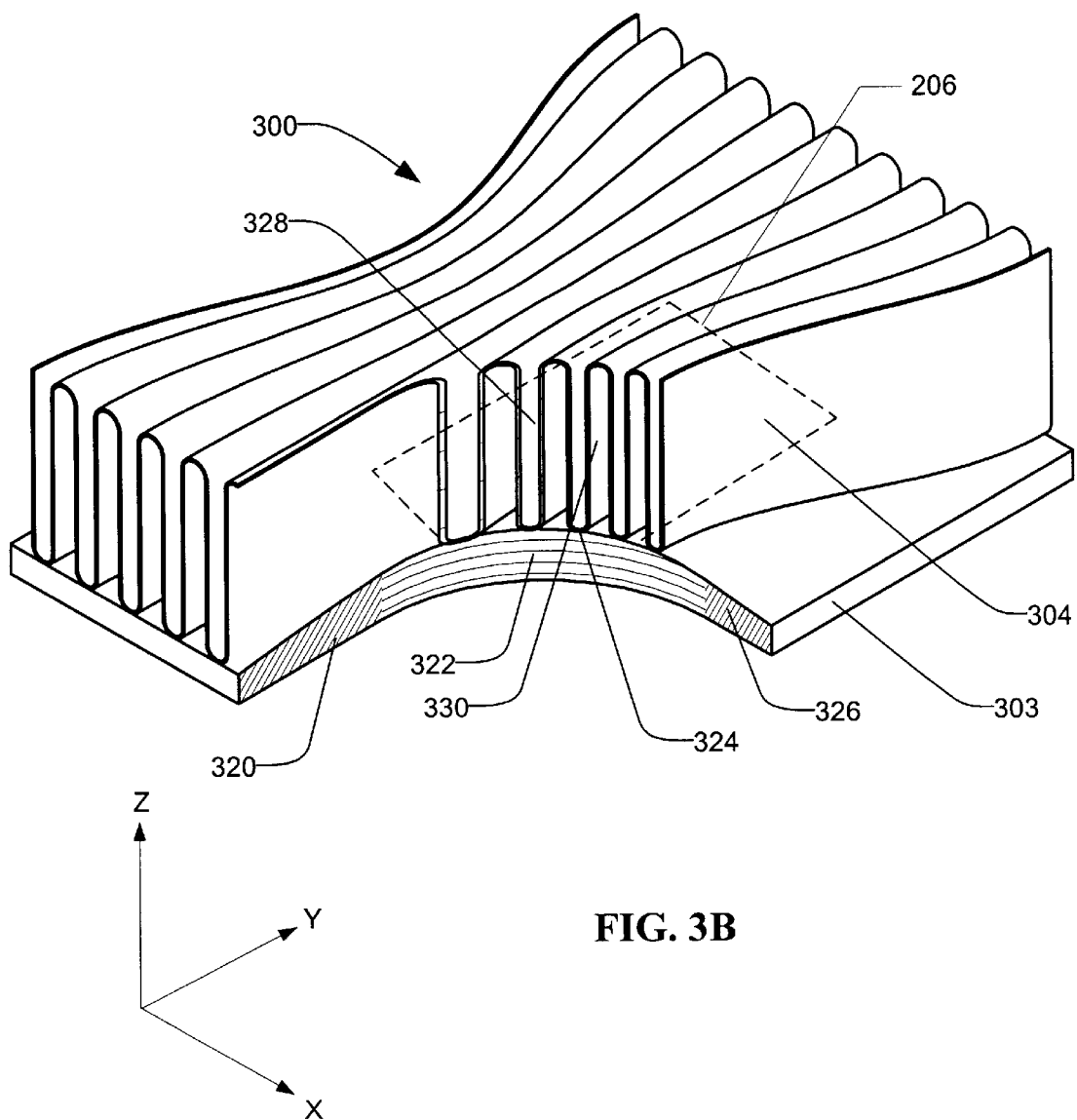
FIG. 3B is a three-dimensional isometric view of FIG. 3A showing a cut-away section.

FIG. 3B shows an isometric section view of FIG. 3A, showing the internal shape of the baseplate 303. The baseplate has a first cross section portion 322 and a second cross section portion 320, 326 thinner than the first cross section portion 322.

In the illustrated embodiment, the cross section of baseplate 303 has a first convex shape along the X-axis and a second convex shape along the Y-axis. The apex of the first convex shape and/or the second convex shape are disposed proximate the first fin array region 206. In the illustrated embodiment, the apex of the first convex shape and the second convex shape are coincident at location 330 and centered at a peak within the first array region 206.

This has the effect of shortening fin section 328 of fin array 304 to maintain flatness of the top surface of the fin array. The fin array 304 can be affixed to the baseplate 303 via joint 324.

Referring again to FIGS. 3A and 3B, the front section of baseplate 303 starts out rectangular in shape and then cures in region 320 increasing in thickness towards region 322 of baseplate 303. The baseplate 303 also is convex and increases in thickness from section 326 to section 322. The increase in thickness increases lateral heat spreading to improve heat transfer to the fins.

Figure 3C:
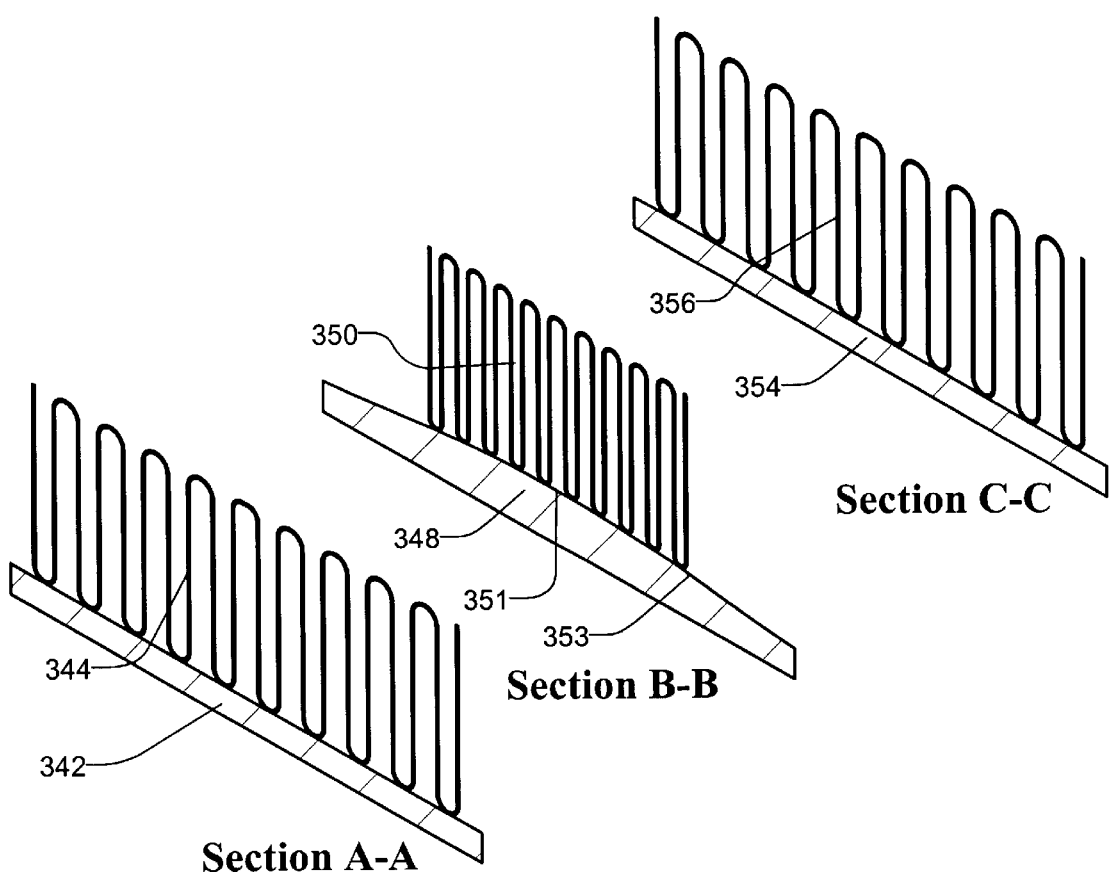
FIG. 3C is a series of lateral section views shown in an isometric view of the invention shown in FIG. 3A.

FIG. 3C is a diagram further illustrating the construction of the vortex heatsink as shown in FIGS. 3A and 3B. Section A—A comprises base section 342 and fin section 344. Note that this is similar to sections of the heatsink shown in FIG. 1. Section B—B illustrates baseplate section 348 and fin array section 350 in the middle section of the heatsink where the fins are compacted into the center of the heatsink assembly. Note the convex-shaped cross section 353 of baseplate section 348 and the apex 351. Note also, that in this embodiment, the bottom surface of the fin array 350 has a shape that conforms to the top surface of the baseplate. Section C—C is identical to section A—A where baseplate section 354 is rectangular in shape and fin array 356 is identical to fin array section 344.

Figure 3D:
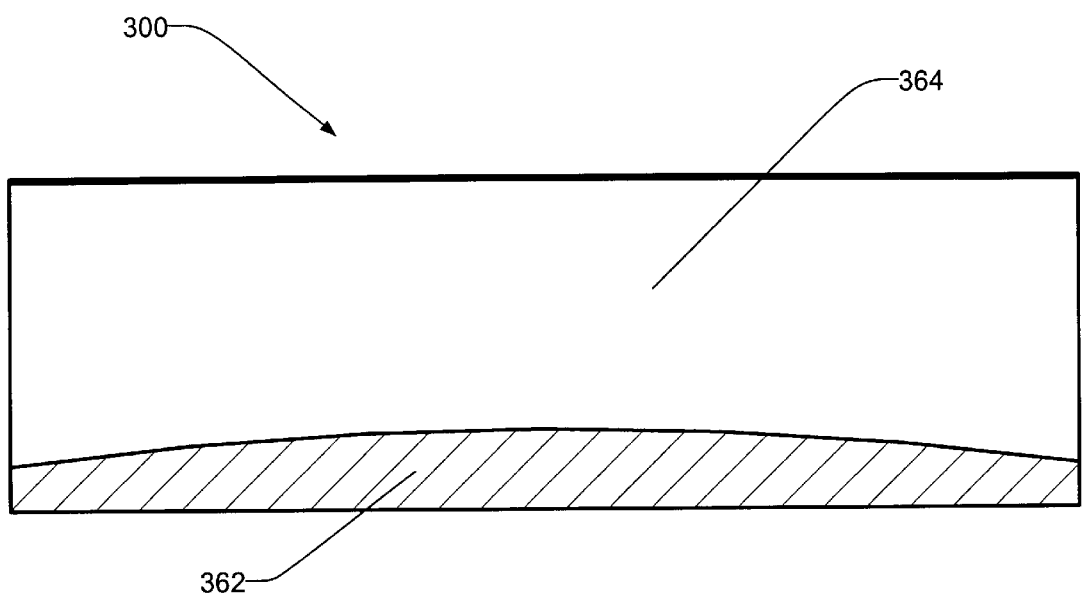
FIG. 3D is a longitudinal section view of the invention shown in FIG. 3A.

FIG. 3D shows a longitudinal section view down the middle of assembly 300. Fin section 364 and baseplate section 362 are both convex in shape. As stated previously, the top surface of the fin array in assembly 300 is substantially flat, however, this need not be the case.

Figure 4:
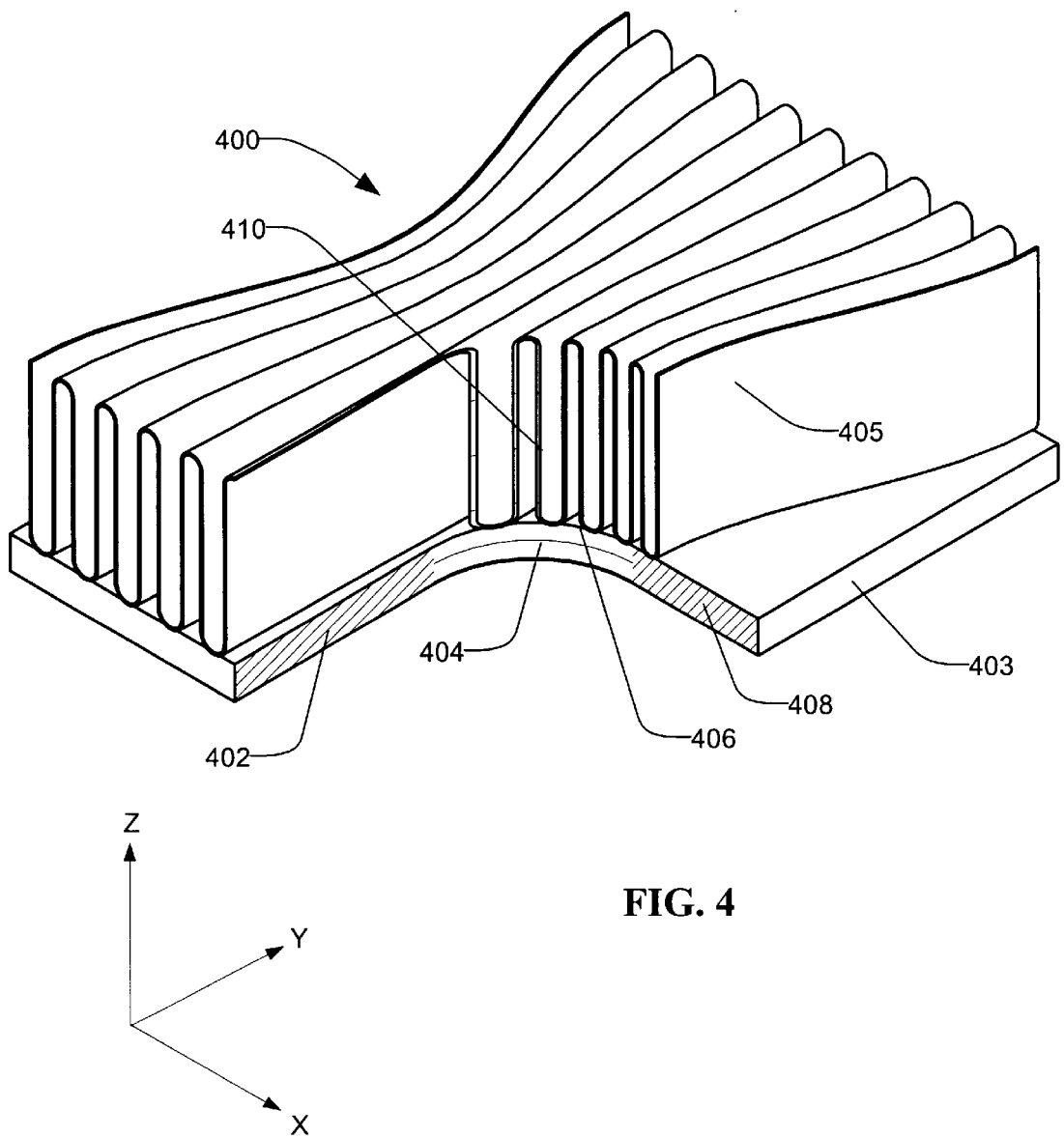
FIG. 4 is an isometric view of one embodiment of the invention shown in FIG. 3A with a cut-away section where the base is flat instead of convex in shape.

FIG. 4 is a diagram presenting another embodiment of the present invention. Assembly 400 comprises a baseplate 403 and a fin array 405. Front section 402 is flat through sections 404 and 408 throughout baseplate 403. Fin section 410 is attached to baseplate in joint 406 and is flat in the middle region unlike that shown in FIGS. 3A–3D. This embodiment may be preferable to the embodiments shown in FIGS. 3A–3D from a cost perspective.

Figure 5:
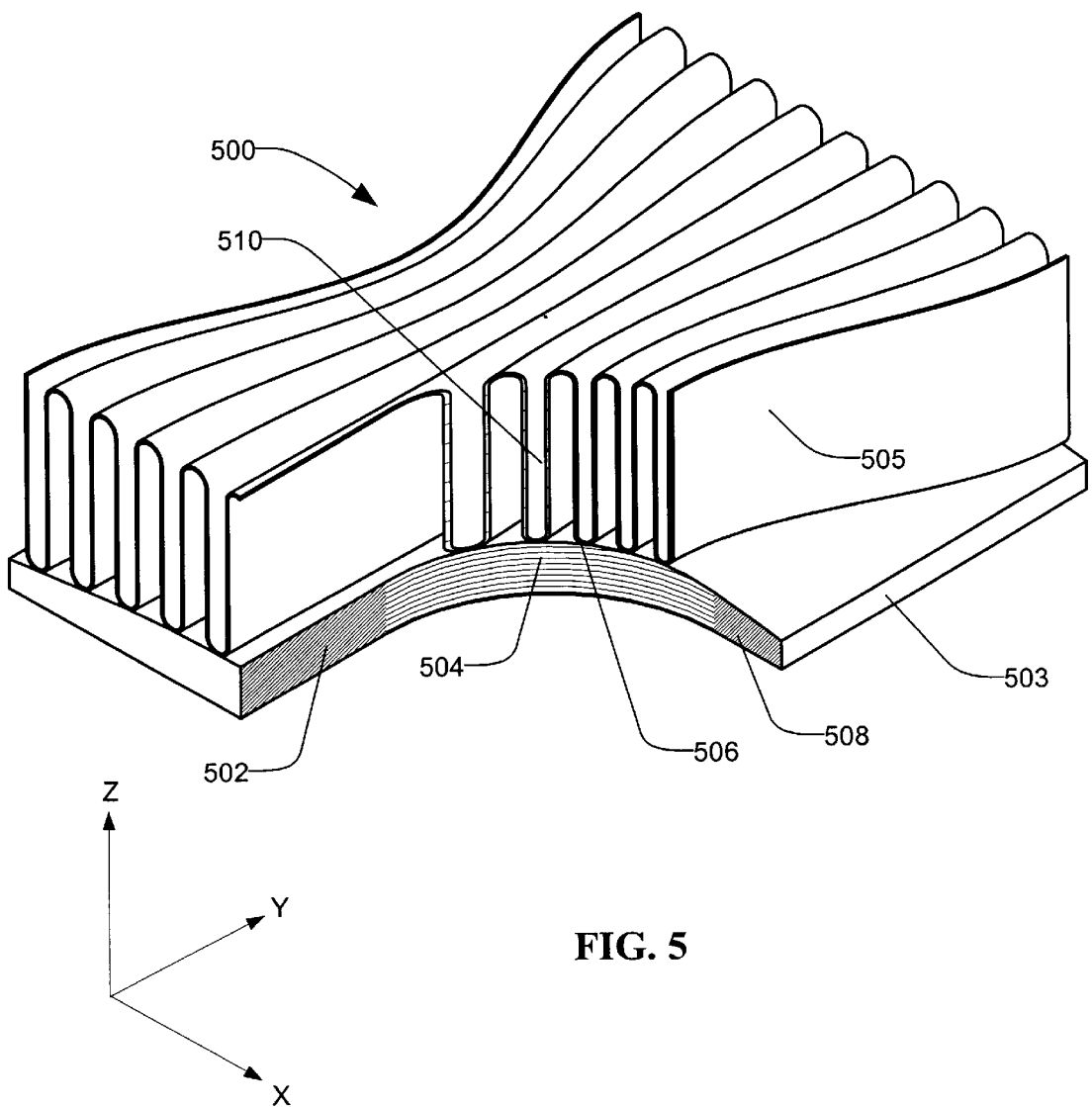
FIG. 5 is an isometric view of another variant of the invention in FIG. 3A with a cut-away section where the base is convex in the X-direction instead of dome-shaped as in FIG. 3A.

FIG. 5 is a diagram depicting another embodiment of the present invention. Assembly 500 comprises array 505 and baseplate 503 where baseplate 503 is convex in one direction only. Section 502 of baseplate 503 is the thickest portion of the baseplate. The baseplate section 508 increases in thickness towards section 504. Fin section 510 may be curvilinear on the bottom of fin array 505 and connected at joint 506. The advantage of the curvilinear baseplate is that it may be made with conventional extrusion technology to improve cost over the conical baseplate while maintaining conductivity laterally throughout the baseplate.

Figure 6A:
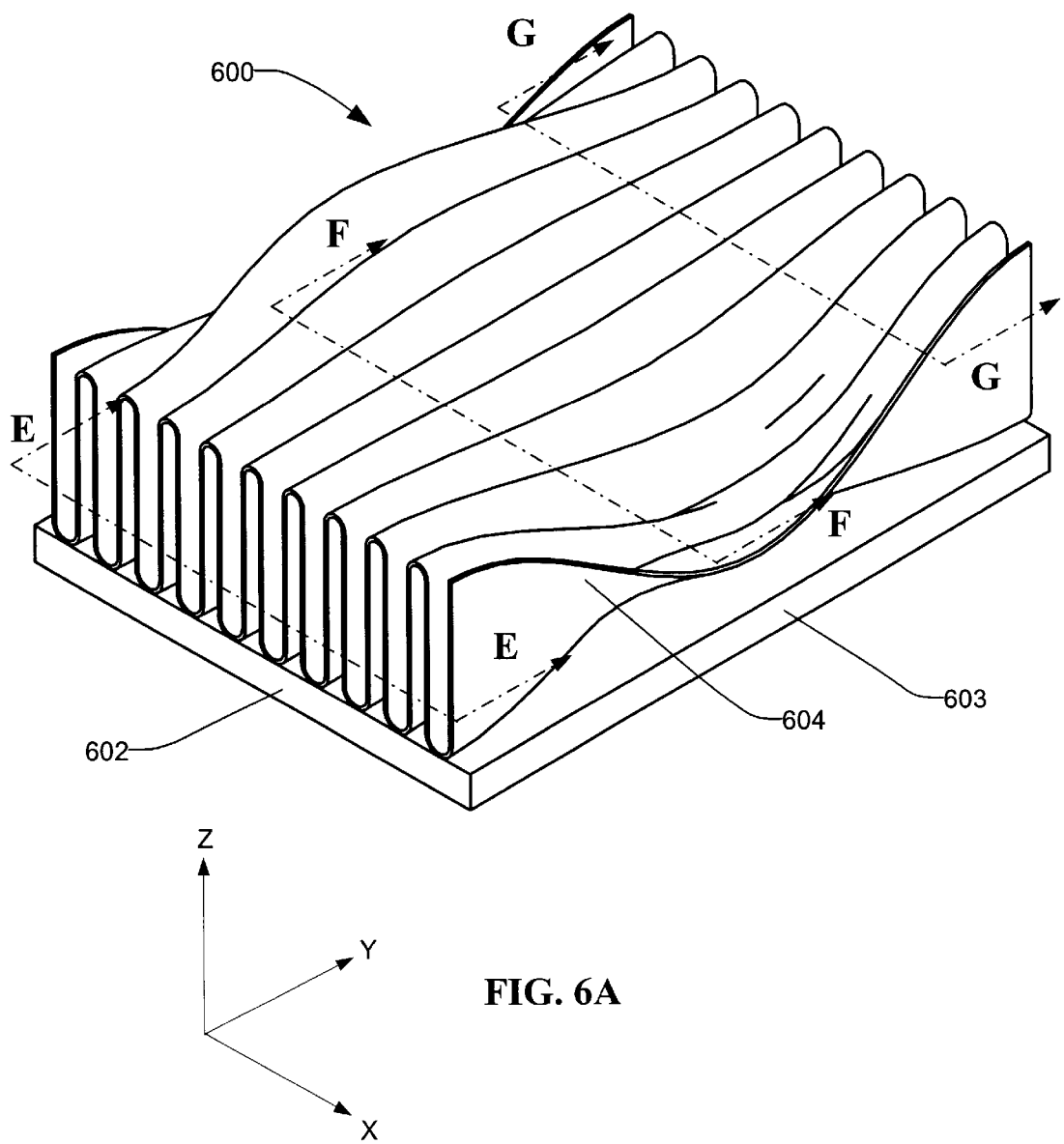
FIG. 6A is an isometric view of an additional variant of the invention in FIG. 3A where the fins are shown in a three-dimensional vortex arrangement.

FIG. 6A is a diagram presenting another embodiment of the invention. Assembly 600 comprises fin array 604 and baseplate 603. End section 602 of baseplate is considered rectangular as illustrated in the previous Figures.

Figure 6B:
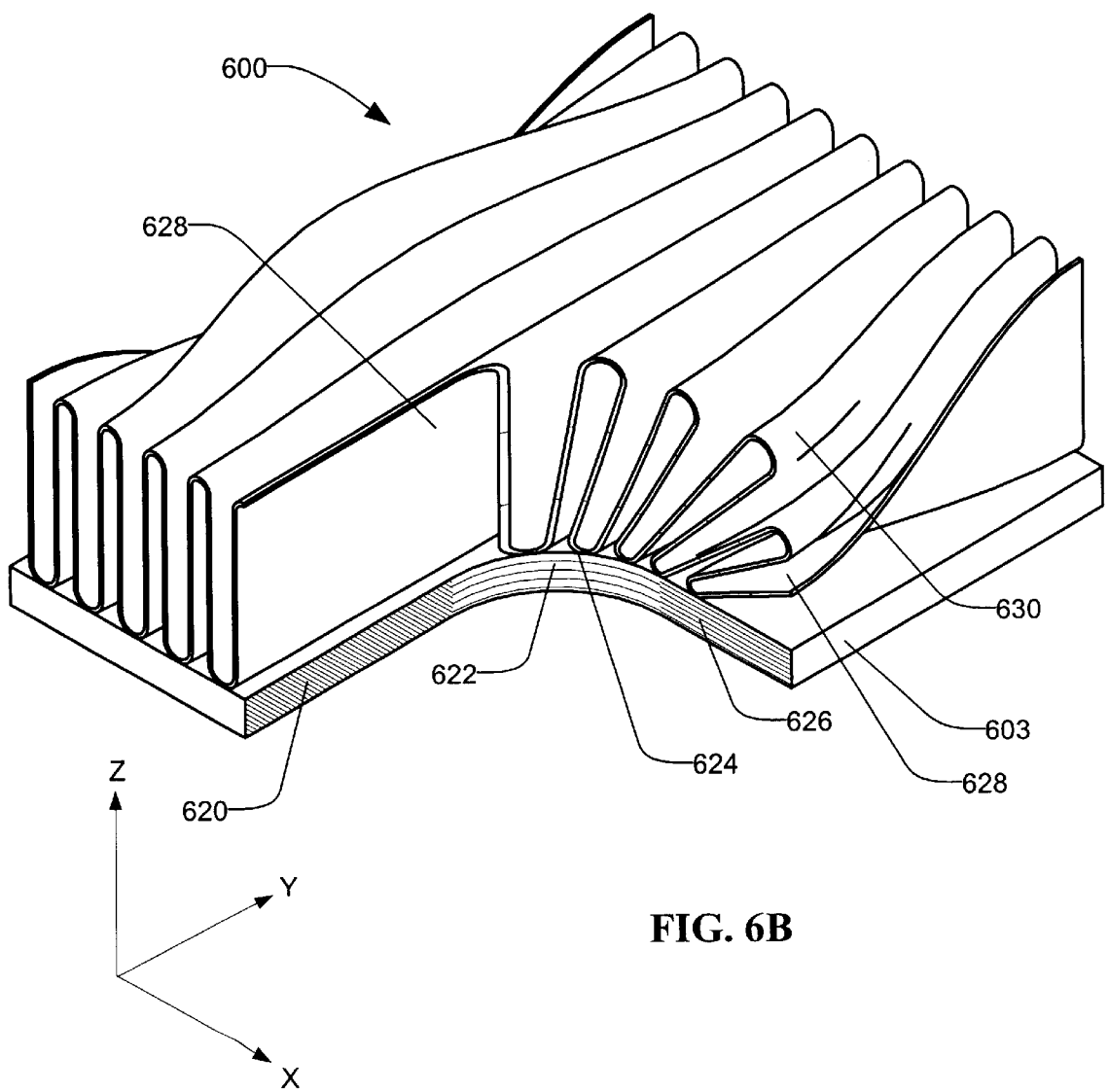
FIG. 6B is an isometric view with a cut-away section of FIG. 6A.

FIG. 6B is a diagram presenting an isometric section view of the embodiment of the invention. Baseplate 630 is flat throughout (but need not be so) as shown in sections 620, 622, and 626. Fin section 628 is joined to the base at 624 and is considered flat in that region as well. Portions 604 of the fins 630 in the fin array are formed into a 'otus' type arrangement to improve convection of air throughout the fin array. This type of arrangement has the benefit of maximizing volumetric area while reducing pressure drop through the heatsink assembly 600.

Figure 6C:
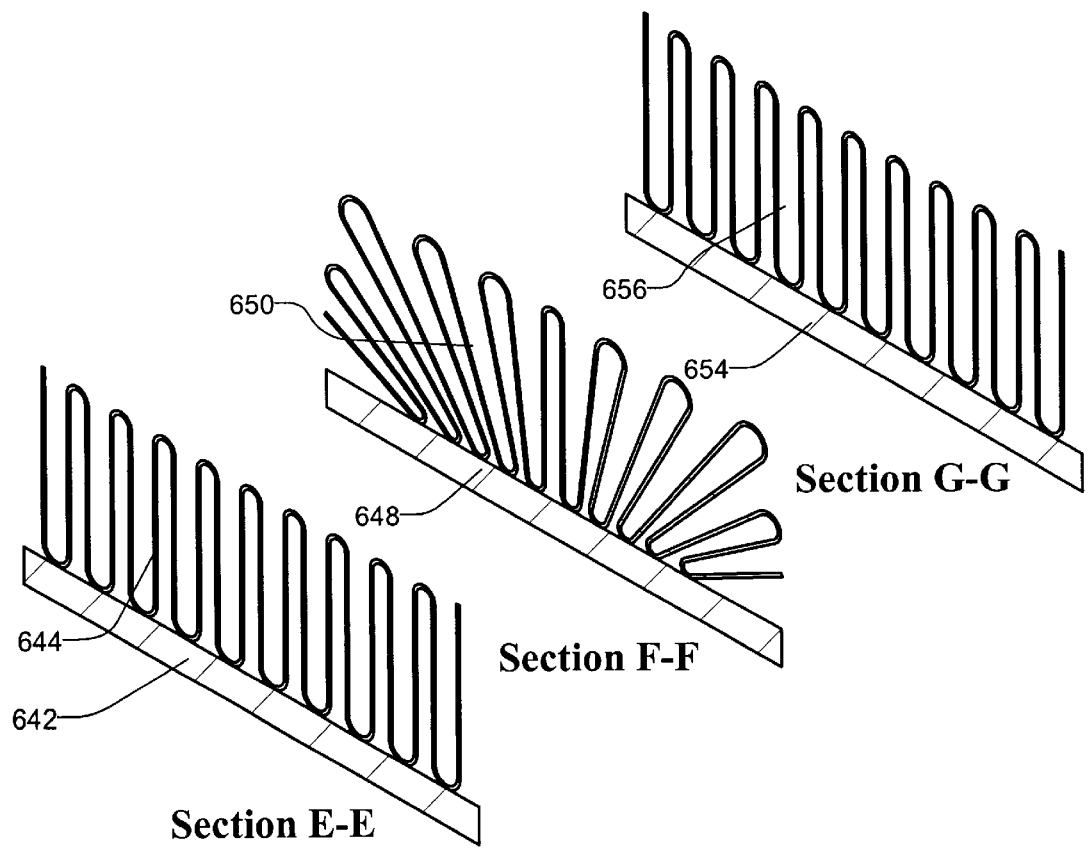
FIG. 6C is a series of lateral section views shown in an isometric of the invention as shown in FIG. 6A.

FIG. 6C is a diagram illustrating the section views of the ends and middle sections of the invention in FIGS. 6A and 6B. The end section E—E is identical to that of the previous embodiments having baseplate section 642 and fin section 644 rectangular in shape. Section F—F illustrates the middle of assembly 600 where the fin section 650 is of a 'lotus' type arrangement and is attached to baseplate 648. End section G—G is identical to section E—E where fin section 656 is attached to baseplate 654.

Figure 6D:
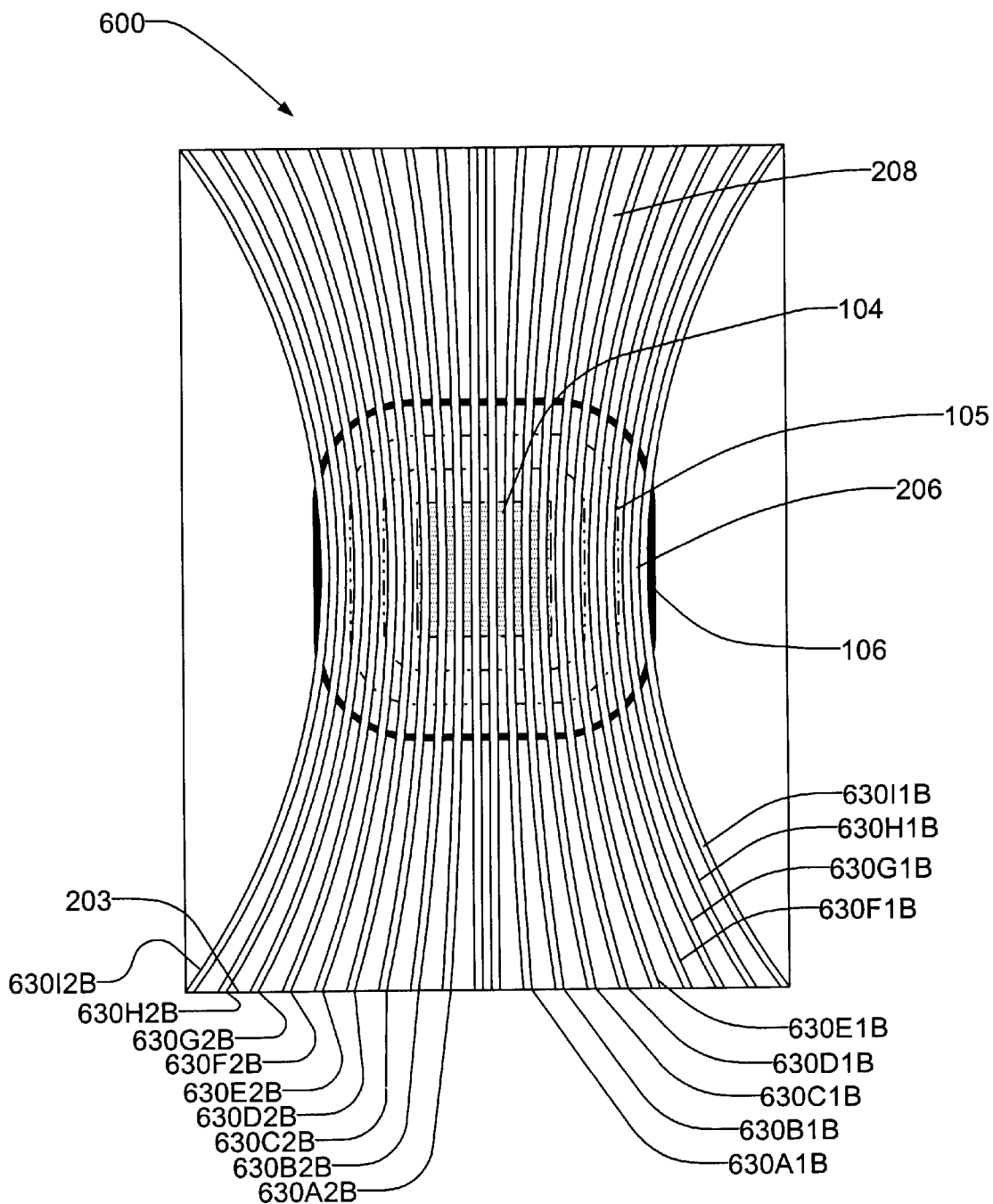
FIGS. 6D and 6E are further views of the invention.
Figure 6E:
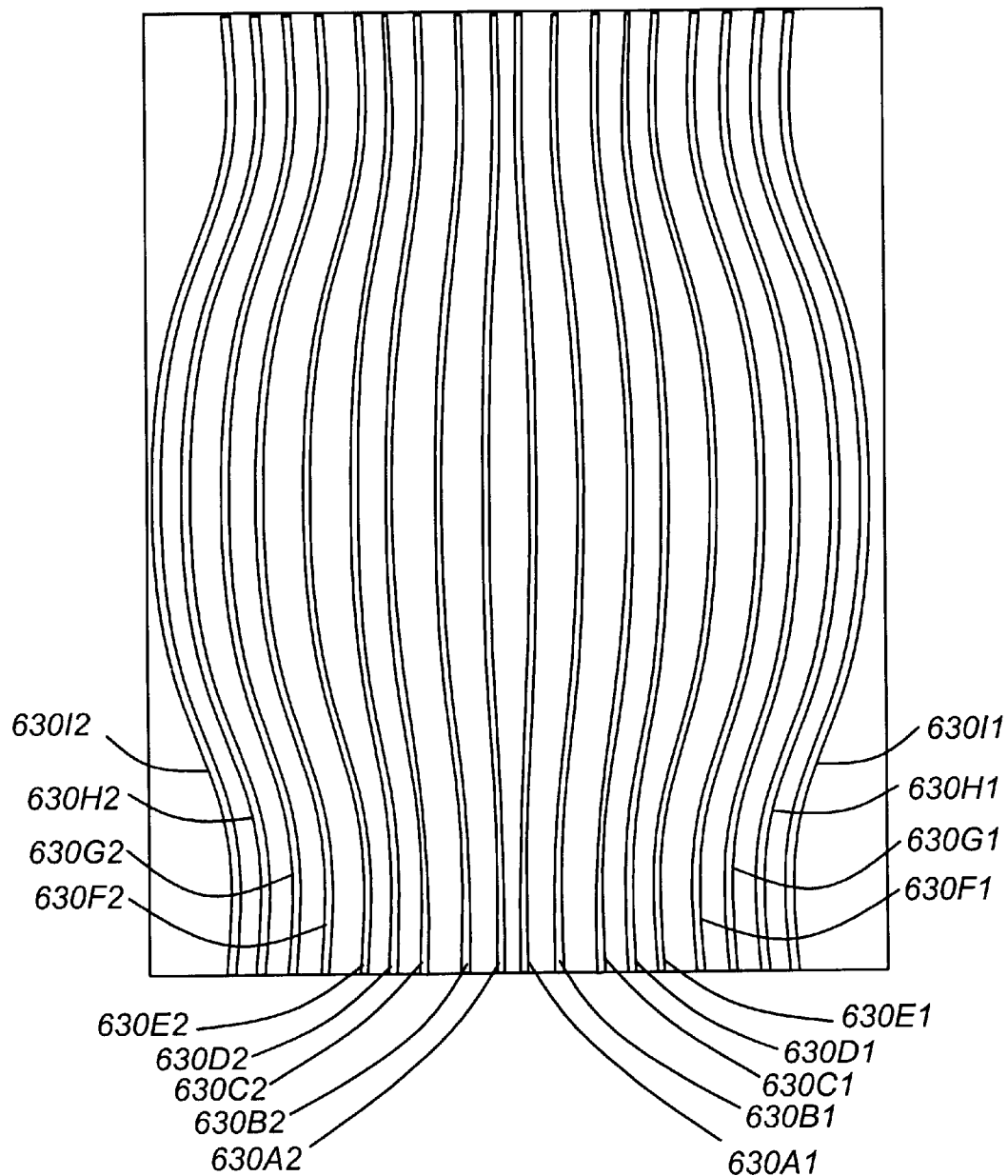

FIGS. 6D and 6E are further section views of the embodiment shown in FIGS. 6A–6C. FIG. 6D is a diagram illustrating a cross section of the fin array in the x-y plane proximate the bottom of the fins. As shown, the fins 630A1-H2 include bottom portions having first concave bottom portions 630A1B–630I1B facing second concave bottom portions 630A2B–630I2B. The bottom portions for the narrowing in the first fin region 206. FIG. 6E is a diagram illustrating a cross section of the fin array in the x-y plane proximate the top of the fins. As shown, the fins 630A1-H2 include top portions having first concave top portions 630A1T–630I1T facing away from the second concave bottom portions 630A2T–630I2T, forming an opening above the narrowing.

Conclusion

This concludes the description of the preferred embodiments of the present invention.

In summary, the present invention describes a method, apparatus, and article of manufacture for providing thermal management of a high performance device through transfer of heat from the device to air through a novel heatsink design.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A heatsink assembly comprising:
    a fin array having a plurality of fins at least some on which are curvilinear, a first plurality of the fins of the fin array comprise first concave fin bottom portions and first convex fin top portions, a second plurality of the fins of the fin array comprise second concave fin bottom portions facing the first concave fin bottom portions, forming a narrowing substantially disposed in the first fin array region, and second convex top portions facing away from the first convex top portions, forming an opening substantially above the narrowing and the fin array having a variable fin density, the fin array including
    a first fin array region having a first fin density aid being proximate to and in thermal contact with the heat dissipating device, and
    a second fin array region having a second fin density y less than the first fin density.

2. An apparatus for cooling a heat-dissipating device, comprising:
    a heat plate having an upper surface;
    a fin array coupled to the heat plate, having a plurality of fins and having a variable fin density, a plurality of the lucrative of fins being non-orthogonal to the upper surface of the heat plate, the fin array including;
    a first fin array region proximate to and in thermal contact with the heat dissipating device;
    a second fin array region distant from the heat dissipating device;
    wherein the first fin region includes a first fin density and the second fin region includes a second fin density less than the first fin density, and at leas some of the plurality of fins in the fin array are curvilinear.

3. The apparatus of claim 2 wherein the fins in the fin array comprise a first plurality of concave fins facing a second plurality of concave fins.

4. The apparatus of claim 3, wherein the first plurality of concave fins and the second plurality of concave fins form a narrowing substantially disposed at the first fin array region.

5. The apparatus of claim 4, wherein the narrowing comprises a venturi shape.

6. The apparatus of claim 2, wherein:
    a first plurality of the fins of the fin array comprise first concave fin bottom portions and first convex fin top portions; and
    a second plurality of the fins of the fin array comprise second concave fin bottom portions facing the first concave fin bottom portions, forming a narrowing substantially disposed in the first fin array region, and second convex top portions facing away from the first convex top portions, forming an opening substantially above the narrowing.

7. The apparatus of claim 2, wherein
    the fin array has a first side facing the heat dissipating device and a second side facing away from the heat dissipating device; and
    the plurality of fins are shaped in a lotus flower arrangement having a narrowed region disposed at a first side of the fin array and proximate the first fin array region and an expanded region disposed proximate a second side of the fin array.

8. The apparatus of claim 2, wherein the heat plate comprises a cross section having a first cross section portion proximate the first fin array region and a second cross section portion proximate the second fin arrant region, wherein the first cross section portion is thicker than the second cross section portion.

9. The apparatus of claim 2, wherein the heat plate comprises a surface having a first convex shape along a first axis, the first convex shape having a first apex disposed proximate the first fin array region.

10. The apparatus of claim 9, wherein the heat plate surface further comprises a second convex shape along a second axis perpendicular to the first axis, the second convex shape having a second apex disposed proximate the first fin array region.

11. The apparatus of claim 10, wherein the fin array comprises a top side and a bottom side adjacent the heat plate, and the fin array bottom side comprises a concave shape substantially mating with the heat plate convex shape.

12. The apparatus of claim 2, wherein the fin array is configured for air to flow into and then out of the fin array.

13. A heatsink assembly comprising:
    a fin array having a plurality of fins and having a variable fin density, at least some of the plurality of fins are curvilinear in three dimensions, the fin array including
    a first fin array region having a first fin density and being proximate to and in thermal contact with the heat dissipating device, and
    a second fin array region having a second fin density less than the first fin density.

14. The apparatus of claim 13, further comprising a heat plate having a cross section with a first cross section portion proximate the first fin array region and a second cross section portion proximate the second fin array region, wherein the first cross section portion is thicker than the second cross section portion.

* * * * *